US007075397B2

(12) United States Patent
Goldie

(10) Patent No.: US 7,075,397 B2
(45) Date of Patent: Jul. 11, 2006

(54) COIL STRUCTURE FOR MAGNETIC RESONANCE IMAGING

(75) Inventor: Frederick Thomas David Goldie, Worthing (GB)

(73) Assignee: Tesla Engineering Limited, Sussex (GB)

( * ) Notice: Subject to any disclaimer, the term of this patent is extended or adjusted under 35 U.S.C. 154(b) by 0 days.

(21) Appl. No.: 10/812,918

(22) Filed: Mar. 31, 2004

(65) Prior Publication Data
US 2005/0035840 A1    Feb. 17, 2005

(30) Foreign Application Priority Data
Apr. 3, 2003    (GB) .................................. 0307728.6

(51) Int. Cl.
*H01F 6/00*    (2006.01)
(52) U.S. Cl. ..................................... 335/216
(58) Field of Classification Search ................ 336/200, 336/232, 223; 335/216, 299–306; 324/318–322
See application file for complete search history.

(56) References Cited

U.S. PATENT DOCUMENTS 4,406,056 A    9/1983    Buckley et al.
4,672,346 A *  6/1987    Miyamoto et al. ........... 335/296
5,568,051 A * 10/1996    Yamagata .................... 324/318
6,181,232 B1 * 1/2001    Kitamura .................... 336/200
6,208,142 B1   3/2001    Wagshul
6,498,555 B1 * 12/2002   Sakata ........................ 336/200
6,507,190 B1 * 1/2003    Hinks et al. ................. 324/307

FOREIGN PATENT DOCUMENTS

GB    1003254    9/1965
WO    WO 99/06310    *  2/1999

OTHER PUBLICATIONS

Patent Abstracts of Japan, vol. 0051, No. 45 (E-074) Sep. 12, 1982, & JP 56079418A (Aichi Electric Mfg Co Ltd), Jun. 30, 1981.

* cited by examiner

*Primary Examiner*—Tuyen T Nguyen
(74) *Attorney, Agent, or Firm*—Nixon & Vanderhye P.C.

(57) ABSTRACT

An electrical coil, particularly a shim coil for use in magnetic resonance imaging spectroscopy, is wound so that there are a plurality of layers with each layer having a plurality of turns. Insulating material is disposed between the turns of each layer. This reduces the capacitance between the turns and has the effect of increasing the self-resonant frequency of the coil. In another embodiment, the coil turn connections are effected so as to divide the overall coil into electrically separated portions and this also increases the self-resonant frequency of the coil.

3 Claims, 2 Drawing Sheets

COIL STRUCTURE FOR MAGNETIC RESONANCE IMAGING

BACKGROUND OF THE INVENTION

1. Field of the Invention

This invention relates to magnetic coil structures for use in magnetic resonance imaging and spectroscopy (MRIS).

2. Related Art

Magnetic resonance imaging and spectroscopy (MRIS) systems generally comprise a plurality of cylindrical concentric coils which are located around a region within which a patient can be located. The coils include an outermost DC coil which is used to provide a strong constant magnetic field, an inner radio frequency (RF) coil arrangement which is arranged concentrically within the DC coil and a gradient coil assembly which is located between the RF coil and the outer DC coil. The gradient coil assembly is arranged to generate a time-varying audio frequency magnetic field which causes the response frequency of the nuclei of the patient to depend upon their positions within the field. The coils which generate the strong constant magnetic field are generally super-conducting coils. The presence of a patient in the magnetic field may distort the main magnetic field making it insufficiently uniform for imaging or spectroscopic measurements. A known method of counter-acting this effect is by providing multi-turn electrical windings known as shim coils and driving DC electrical currents through those windings. A typical high performance MRIS system may contain 8 to 12 shim coils, each of which is arranged to correct an inhomogeneity with a particular spatial form. The shim coils can also be used to correct intrinsic inhomogeneities of the super-conductive magnet itself.

It is common practice to incorporate shim coils within the structure of the actively shielded gradient coil assemblies which are switched rapidly on and off in a precisely timed sequence to generate MR images. The gradient sequence contains a range of frequencies from zero to 10 kHz or more and this is often referred to as "audio frequency".

As MRIS systems have developed they have operated at higher and higher magnetic fields, eg 3T and above. As a consequence, the field strengths required from the shim coils increase proportionately resulting in coils with ever increasing numbers of turns. It is often necessary to use packs of multi-layered windings to obtain the required field strength (see FIG. 1). A problem with such arrangements is that the packs become what is known as self-resonant at relatively low frequencies, eg below 20 kHz. In some cases the resonance may couple to a nearby gradient coil and its amplifier causing them to become unstable. This can disrupt the precise timing of the gradient sequence with a consequent degradation of the performance of the MRIS system.

A further problem with such arrangements is that changing currents in a gradient coil may induce voltages in the shim coil that are large enough to cause insulation between shim coils in adjacent layers to break down leading to failure of the entire coil.

Self resonance means that currents are flowing in sub-sections of the windings of a coil coupled by internal capacitance. Such currents may be induced even though the coil, as a whole, does not have the correct symmetry to interact with the gradient coil. Furthermore, such currents may be induced even though the coil itself is open circuit.

BRIEF SUMMARY OF THE INVENTION

The present invention is concerned with techniques for overcoming or alleviating this problem.

According to a first aspect of the present invention, there is provided an electrical coil which is wound so that there are a plurality of layers with each layer having a plurality of turns, wherein an insulating material is disposed between the turns of each layer. The insulating material reduces the capacitance between the turns and this has the effect of increasing the self-resonant frequency of the coil. Thus, in the case of a shim coil for use in MRIS, the self-resonant frequency of that coil may be raised to a value beyond the band width of the amplifier associated with the gradient coils. This consequently has the effect of reducing the problem of self-resonance. It also improves the insulation between layers, reducing the likelihood of insulation breakdown between adjacent shim coil layers.

According to another aspect of the present invention there is provided an electrical coil which comprises a plurality of layers each with n turns wherein the coil is wound so as to comprise two or more portions each of which has layers which contain fewer than n turns. By forming the coil in portions in this way inter-turn voltages are reduced and in the case of a shim coil this has the effect of increasing the self-resonant frequency and further reducing the likelihood of insulation breakdown between adjacent shim coil layers. If such a coil is formed with the insulating feature of the first aspect the self-resonant frequency can be increased still further.

The invention will be described now by way of example only with particular reference to the accompanying drawings.

In the drawings:

DETAILED DESCRIPTION OF EXEMPLARY EMBODIMENTS

Figure 1:
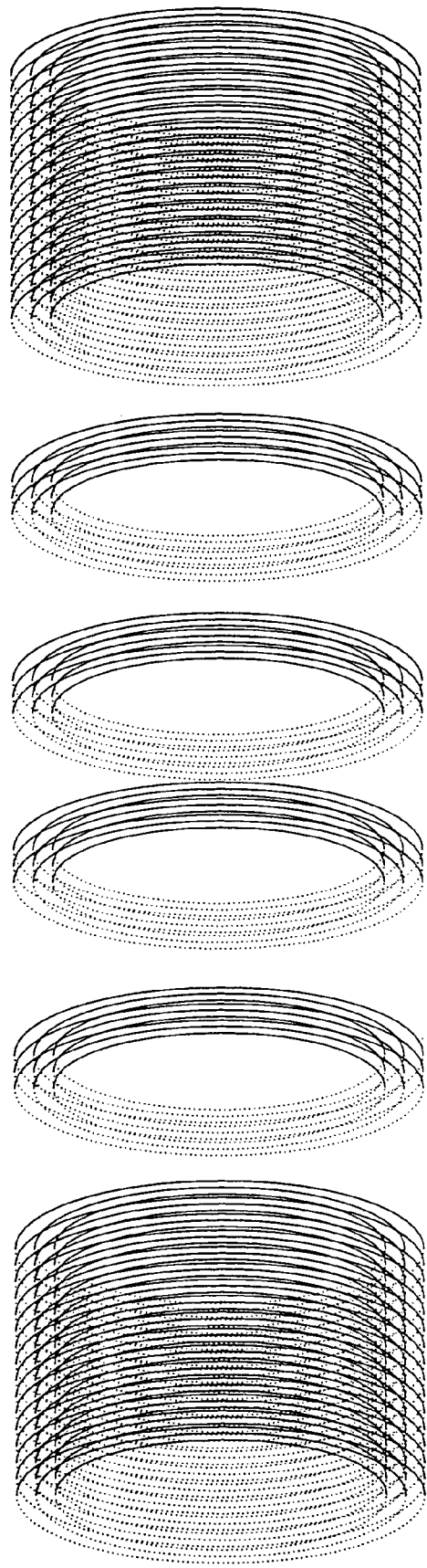
FIG. 1 is a schematic view illustrating a typical arrangement of shim coils used in MRIS.
Figure 2A:
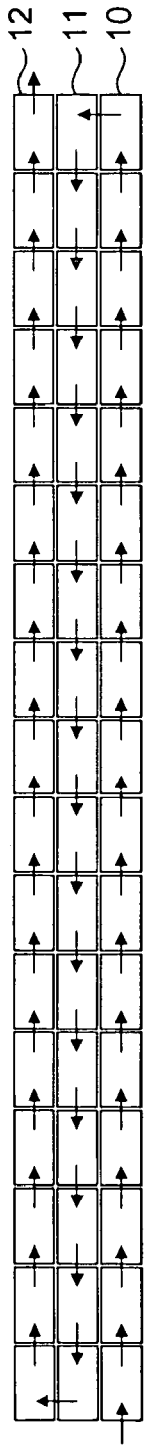
FIG. 2A is a cross-section through a single block of such shim coil.

FIG. 1 shows schematically how shim coils are particularly arranged into packs or blocks for use in MRIS systems. As has been explained, currents can flow in sub-sections of the windings of such coils coupled by internal capacitance and this is illustrated in FIG. 2A of the drawings which shows the inter-turn connections. This Figure shows three layers 10, 11, 12 each having a number of turns 15. The illustrated inter-turn connections have the effect of producing so-called self-resonance which can affect the performance of the MRIS system.

Figure 2B:
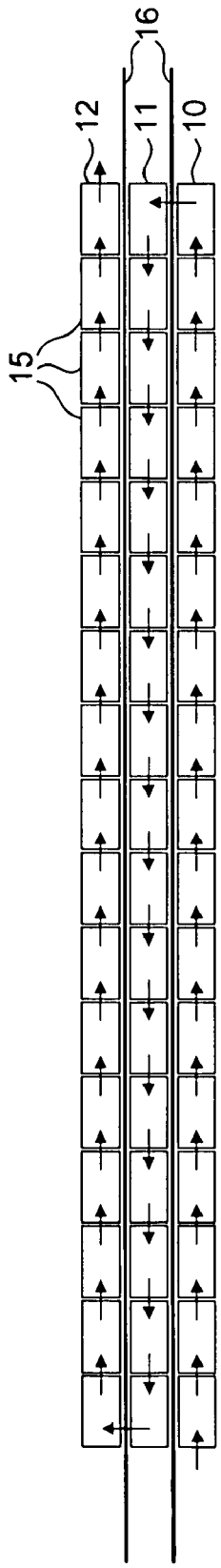
FIG. 2B is a cross-section illustrating one embodiment in accordance with the present invention.

FIG. 2B illustrates a first embodiment of the present invention for reducing or alleviating this self-resonant effect. In this first embodiment there are illustrated three layers 10, 11 and 12 of windings each having a number of turns 15. The coil has been formed in such a way that each layer of turns is separated from the next layer by a layer of insulating material 16. The layer of insulating material may for example, be a layer of glass cloth having a thickness of 0.2 mm. The presence of the layer 16 has the effect of increasing the self-resonant frequency of the coil.

Considering as an example a multi-layer pack of windings having five layers with 27 turns per layer, this gives 135 turns in total. For minimum resistance, the windings will typically be made from rectangular section lacquered wire and be very closely packed as shown in FIG. 2a.

For such an example, a layer of glass cloth 16 0.2 mm thick has the effect of increasing the self-resonant frequency from 14.75 kHz to 23.0 kHz taking it outside the typical bandwidth of the amplifier of the gradient coils.

Figure 2C:
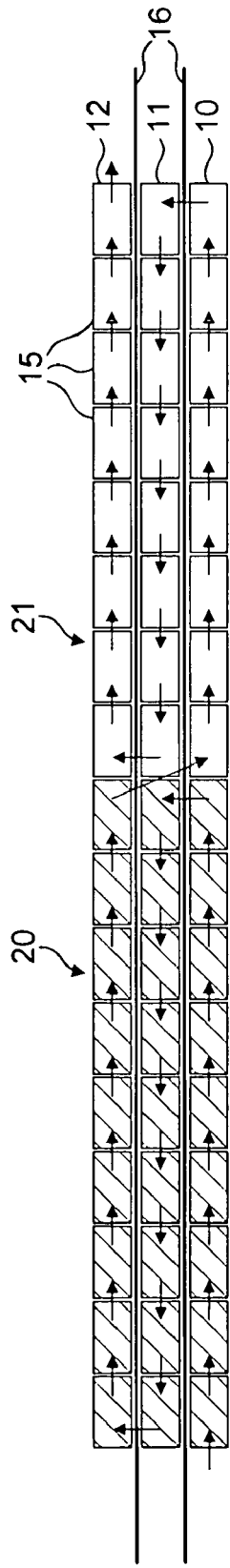
FIG. 2C is a cross-section illustrating another embodiment in accordance with the present invention.

A second embodiment of the present invention is illustrated in FIG. 2C of the drawings. A pack such as that shown in FIG. 2A of the drawings which has five layers with 27 turns per layer can have up to 54 turns connected in series between physically adjacent turns in adjacent layers. This means that substantial internal voltages can build up inside the coil and this leads to high capacitive stored energy and the possibility of insulation breakdown.

This effect is reduced by structuring the coil as shown in FIG. 2C of the drawings. The principle illustrated in FIG. 2C is to divide the coil into multiple portions (20, 21) so that, for example, for the specific coil referred to above, there is one portion having 13 turns in five layers and another portion having 14 turns in five layers. This means that the internal voltages referred to above are significantly reduced and again, this has the consequence of increasing the self-resonant frequency and reducing the likelihood of insulation breakdown. The coil can be divided into as many portions as are deemed necessary to provide the appropriate increase in self-resonant frequency. Advantageously, the technique of forming the coil in portions can be used in conjunction with the technique of using insulating material between the layers in the manner illustrated in FIG. 2C. For the example of the coil given above, the self-resonant frequency can be increased to 46 kHz. It will be appreciated that further increases in resonant frequency can be achieved by subdividing the coil into more portions than those illustrated in FIG. 2C.

The techniques for increasing the self-resonant frequency have been described above in relation to axial shim coils. It will be appreciated that they are applicable equally to other coil types such as transverse shim coils.

The invention claimed is:

1. An MRI apparatus which comprises an MRI shim coil having one or more coil sections containing a plurality of layers of windings made of insulated conductor, each layer having a plurality of layers of windings made of insulated conductor, each layer having a plurality of turns, wherein said one or more coil sections are each wound in two or more sub-sections, each sub-section of a coil section incorporating some or all of said plurality of layers, and having fewer turns per layer than the coil section of which it forms a part whereby reduction of a self-resonant frequency of the shim coil can be reduced.

2. An MRI apparatus as in claim 1 wherein insulating material is disposed between each layer of turns in addition to insulation otherwise disposed about each said insulated conductor.

3. An MRI apparatus as in claim 2 wherein the insulating material is glass cloth.

* * * * *